(12) United States Patent
Yan et al.

(10) Patent No.: US 8,050,109 B2
(45) Date of Patent: Nov. 1, 2011

(54) SEMICONDUCTOR MEMORY WITH IMPROVED MEMORY BLOCK SWITCHING

(75) Inventors: Thomas Yan, San Jose, CA (US); Luca Fasoli, San Jose, CA (US); Roy E Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 185 days.

(21) Appl. No.: 12/538,492

(22) Filed: Aug. 10, 2009

(65) Prior Publication Data

US 2011/0032774 A1 Feb. 10, 2011

(51) Int. Cl.
*G11C 7/10* (2006.01)
(52) U.S. Cl. .................. 365/189.05; 365/148; 365/163
(58) Field of Classification Search ............. 365/189.05, 365/148, 163
See application file for complete search history.

(56) References Cited

U.S. PATENT DOCUMENTS

| | | | |
|---|---|---|---|
| 5,337,273 | A | 8/1994 | McClure |
| 6,618,295 | B2 | 9/2003 | Scheuerlein |
| 6,711,067 | B1 | 3/2004 | Kablanian |
| 6,785,179 | B1 | 8/2004 | Bull et al. |
| 6,859,392 | B2 | 2/2005 | Abedifard et al. |
| 6,879,505 | B2 | 4/2005 | Scheuerlein |
| 7,511,986 | B2 * | 3/2009 | Horii et al. .................. 365/148 |
| 2004/0141393 | A1 | 7/2004 | Ku |
| 2004/0264281 | A1 | 12/2004 | Vangal |
| 2008/0159032 | A1 | 7/2008 | Lin |
| 2009/0116271 | A1 | 5/2009 | Yamada |

OTHER PUBLICATIONS

Mai, et al., "Low-Power SRAM Design Using Half-Swing Pulse-Mode Techniques," IEEE Journal of Solid-State Circuits, vol. 33, No. 11, Nov. 1998, 13 pages.
Yang, "A Low-Power Charge-Recycling ROM Architecture," IEEE Transactions on a Very Large Scale Integration (VLSI) Systems, vol. 11, No. 4 Aug. 2003.
Yang, "A Low-Power ROM Using Charge Recycling and Charge Sharing Techniques," IEEE Journal of Solid-State Circuits, vol. 38, No. 4, Apr. 2003.
PCT International Search Report, dated Nov. 8, 2010, PCT Patent Appl. No. PCT/US2010/044815.
Written Opinion of the International Searching Authority, dated Nov. 8, 2010, PCT Patent Appl. No. PCT/US2010/044815.

* cited by examiner

*Primary Examiner* — Huan Hoang
(74) *Attorney, Agent, or Firm* — Vierra Magen Marcus & DeNiro LLP

(57) ABSTRACT

A non-volatile memory core comprises one or more memory bays. Each memory bay comprises one or more memory blocks that include a grouping of non-volatile storage elements. In one embodiment, memory blocks in a particular memory bay share a group of read/write circuits. During a memory operation, memory blocks are transitioned into active and inactive states. The process of transitioning blocks from an inactive state to an active state includes enabling charge sharing between a memory block entering the active state and another memory block that was previously in the active state. This charge sharing improves performance and/or reduces energy consumption for the memory system.

20 Claims, 15 Drawing Sheets

SEMICONDUCTOR MEMORY WITH IMPROVED MEMORY BLOCK SWITCHING

BACKGROUND

1. Field

The present invention relates to technology for data storage.

2. Description of the Related Art

Non-volatile memory is widely used in various electronic devices such as cellular telephones, digital cameras, personal digital assistants, mobile computing devices, and non-mobile computing devices. Non-volatile memory allows information to be stored and retained even when an electronic device is not connected to a source of power (e.g., a battery). Three characteristics of a non-volatile memory device include its cost, energy consumption, and performance. The performance characteristic of a non-volatile memory device includes the time necessary to write information to the memory device and the time necessary to read information from the memory device.

Many commercially available non-volatile memory devices (e.g., NAND flash memory cards) contain two-dimensional arrays of non-volatile memory cells. The memory cells within a two-dimensional array form a single layer of memory cells and are selected via control lines in the X and Y directions. Two-dimensional arrays are typically formed on top of a silicon substrate. In contrast, the memory cells within a monolithic three-dimensional array form multiple "vertically aligned" layers of memory cells and are selected via control lines in the X, Y, and Z directions. A monolithic three-dimensional array is one in which multiple layers of memory cells are formed above a single substrate with no intervening substrates. Three-dimensional arrays of memory cells may be cheaper to fabricate than two-dimensional arrays of memory cells if the additional cost of forming multiple "vertically aligned" layers of memory cells is less than the cost of forming either wider or a greater number of two-dimensional arrays (i.e., if the cost of building memory layers vertically is less than the cost of building memory layers horizontally).

Three-dimensional memory arrays having more than one layer of memory cells have been formed by vertically aligning two-dimensional cross-point memory arrays. A cross-point memory array is one in which memory cells are placed at the intersection of a first set of control lines and a perpendicular second set of control lines. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory Array."

DETAILED DESCRIPTION

One example of a non-volatile memory device comprises one or more memory bays (or other groupings). Each memory bay (or other grouping) comprises one or more memory blocks that include a grouping of non-volatile storage elements. Structures other than blocks can also be used. In one embodiment, memory blocks in a particular memory bay share a group of read/write circuits. During a memory operation, memory blocks are transitioned into active and inactive states. The process of transitioning blocks from an inactive state to an active state includes enabling charge sharing between a memory block entering the active state and another memory block that was previously in the active state. This charge sharing improves performance and/or reduces energy consumption for the memory system.

Figure 1:
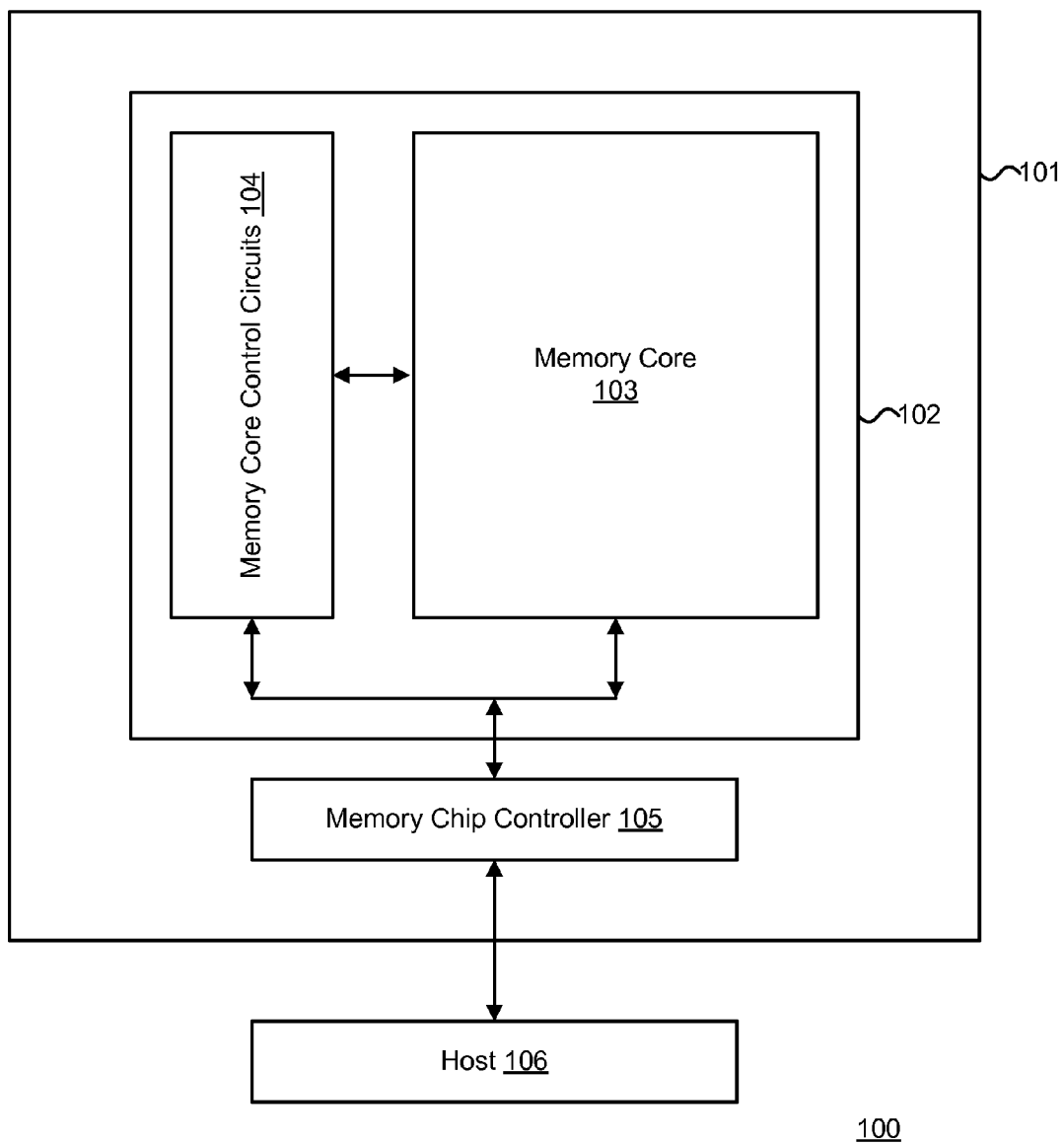
FIG. 1 is a block diagram of one embodiment of a memory system.

FIG. 1 is a block diagram that depicts one embodiment of a memory system 100 that can implement the memory block switching technique described herein. Memory system 100 includes a host 106 (e.g., a personal computer or cellular telephone) and a memory card 101. The memory card 101 includes a memory chip controller 105 and a memory chip 102. The memory chip controller 105, which may include one or more state machines, page registers, SRAM, or other control logic for controlling the operation of memory chip 102, receives data and commands from host 106 and provides data to host 106. In one embodiment, the memory chip controller 105 and memory chip 102 are arranged on a single integrated circuit. In other embodiments, memory chip controller 105 and memory chip 102 are arranged on different integrated circuits. The memory chip 102 includes memory core control circuits 104 and a memory core 103. Memory core control circuits 104 may include logic for controlling the selection of memory blocks, controlling the regulation of voltage references when biasing a particular memory block into a read or write state, or generating row and column addresses. The memory core 103 may include a two-dimensional or three-dimensional array of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1, a memory card operation is initiated when host 106 sends instructions to memory chip controller 105 indicating that it would like to read data from memory card 101 or write data to memory card 101. In the event of a write operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors corrected by circuitry within memory chip controller 105.

Referring again to FIG. 1, after decoding instructions from host 106, memory chip controller 105 will control the operation of memory chip 102. For example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data or a redirection pointer to a new memory location. Once a read or write operation is initiated by memory chip controller 105, memory core control circuits 104 will generate bias voltages for word lines and bit lines within memory core 103, as well as generate the appropriate memory block, row, and column addresses.

Figure 2A:
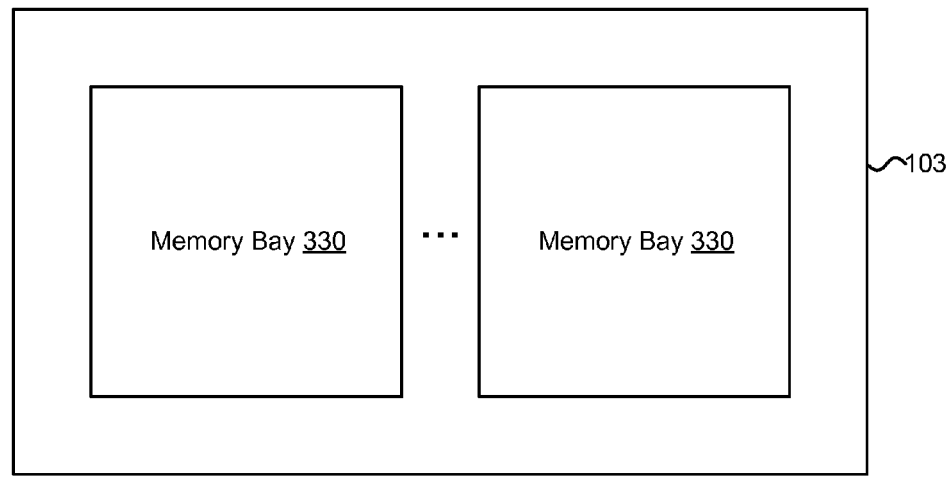
FIG. 2A is a logical view of one embodiment of a memory core.

FIG. 2A depicts a logical block diagram of memory core 103 having two memory bays 330. The number of memory bays per memory core can be different for different implementations. Some embodiments may use only one memory bay per memory core. In one embodiment of a memory core, there are 16 memory bays.

Figure 2B:
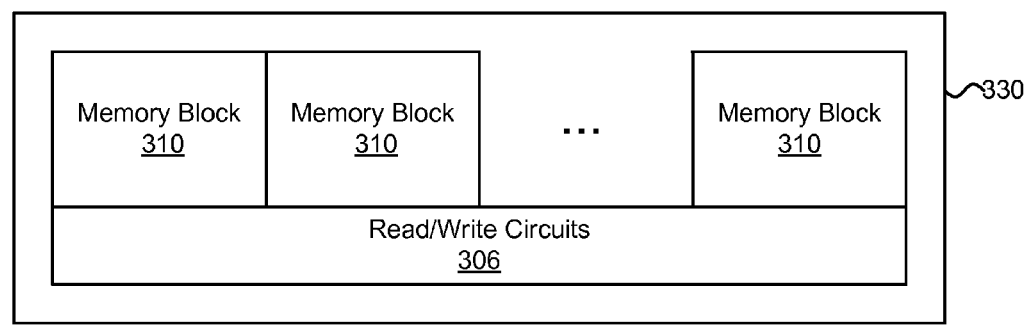
FIG. 2B is a logical view of one embodiment of a memory bay.

FIG. 2B depicts a logical block diagram of one example of a memory bay 330 including memory blocks 310 and read/write circuits 306. Although FIG. 2B shows three memory blocks in the memory bay, more or less than three memory blocks can be used. In one embodiment, there are 32 memory blocks per memory bay 330. While read/write circuits 306 are depicted in FIG. 2B as being below three memory blocks 310, this does not indicate physical placement. Read/write circuits 306 include circuitry for reading and writing memory cells within a memory block 310. As depicted in FIG. 2B, the read/write circuits 306 may be shared across multiple memory blocks within a memory bay. This allows chip area to be reduced since a single group of read/write circuits 306 can support multiple memory blocks. However, in some embodiments, only a single memory block should be electrically coupled to read/write circuits 306 at a particular time to avoid signal conflicts.

Figure 2C:
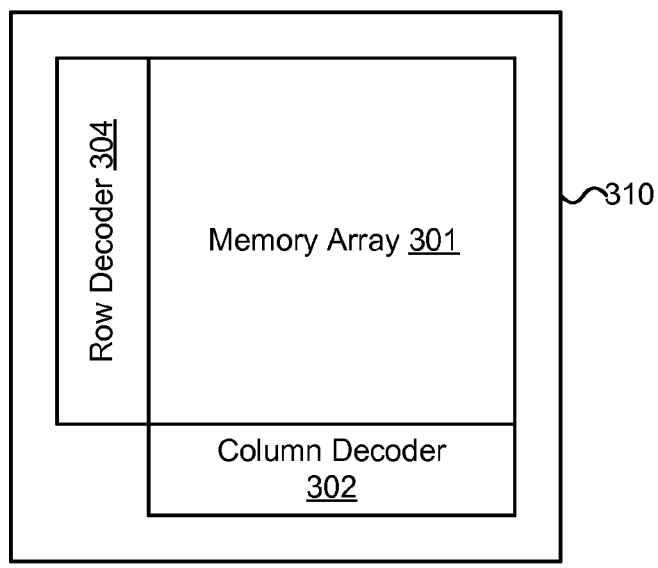
FIG. 2C is a logical view of one embodiment of a memory block.

FIG. 2C depicts a logical block diagram of one example of a memory block 310 that includes a memory array 301, row decoder 304, and column decoder 302. Memory array 301 comprises a contiguous group of non-volatile memory cells having contiguous word and bit lines generally unbroken by circuits such as those for decoding word lines or bit lines. Memory array 301 may comprise one or more layers of memory cells (e.g., 4 memory layers). The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits. In one embodiment, the number of word lines is 4K per memory layer, the number of bit lines is 1K per memory layer, and the number of memory layers is 4, providing a memory array 301 containing 16M memory cells.

FIGS. 2A-2C depict one embodiment of a memory core organization that includes a memory core having multiple memory bays, and each memory bay having multiple memory blocks. Although a memory core organization is disclosed where memory bays comprise memory blocks, and memory blocks comprise a group of non-volatile memory cells, other organizations or groupings can also be used with the technology described herein.

Figure 3A:
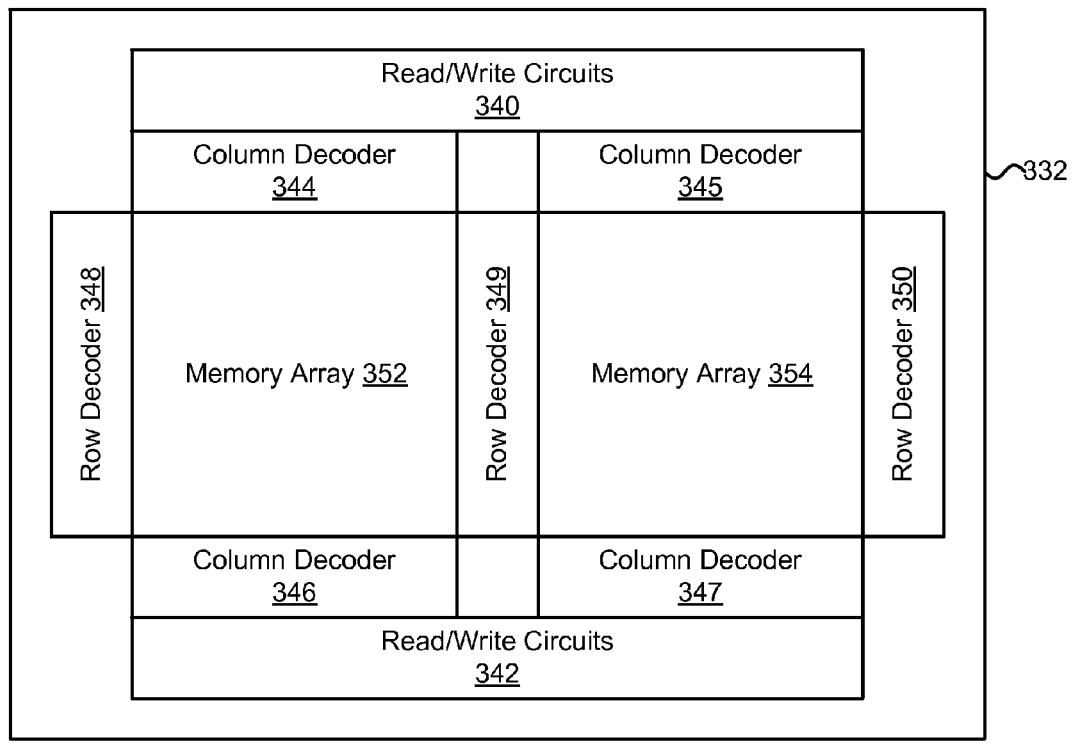
FIG. 3A is a logical view of one embodiment of a memory bay including shared and split decoders.

In some embodiments, row decoder 304 and/or column decoder 302 can be split or shared between memory arrays. One embodiment of a memory bay 332, depicted in FIG. 3A, includes a shared row decoder 349 and two memory arrays 352 and 354. As compared to memory bay 330 depicted in FIG. 2B, memory bay 332 has two groupings of read/write circuits, 340 and 342, and the two memory arrays 352 and 354 share row decoder 349. Row decoder 349 controls word lines in both memory arrays 352 and 354 (i.e., the word lines driven by row decoder 349 are shared). Row decoders 348 and 349 are split such that even word lines are driven by row decoder 348 and odd word lines are driven by row decoder 349. Column decoders 344 and 346 are split such that even bit lines are controlled by column decoder 346 and odd bit lines are driven by column decoder 344. The selected bit lines controlled by column decoder 344 can be electrically coupled to read/write circuits 340. The selected bit lines controlled by column decoder 346 can be electrically coupled to read/write circuits 342. Splitting the read/write circuits when the column decoders are split allows for a more efficient layout.

Figure 3B:
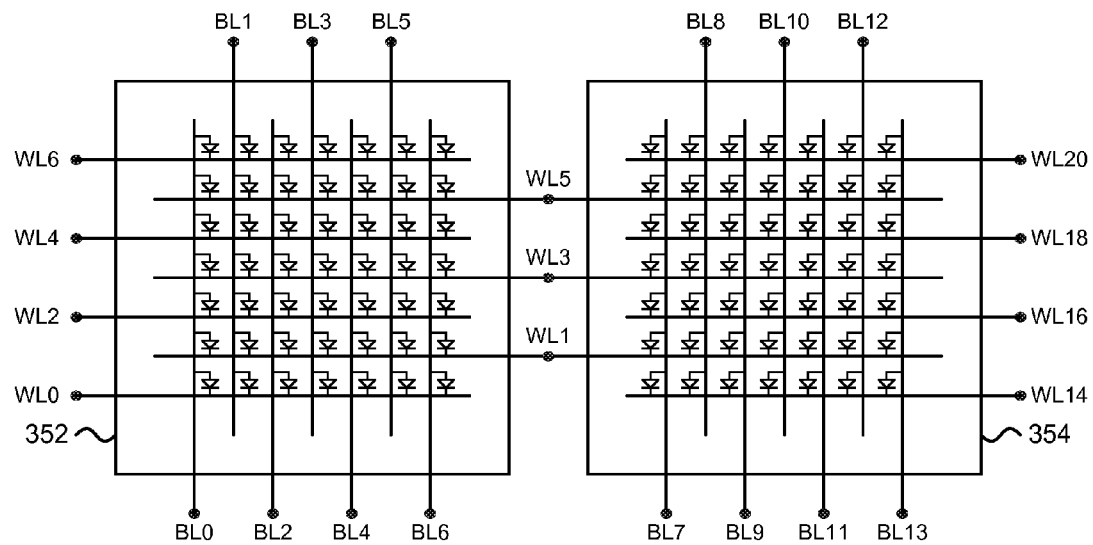
FIG. 3B is a simplified schematic diagram of one embodiment where word lines are shared between memory arrays.

A simplified schematic diagram including word lines and bit lines and corresponding to memory bay 332 is depicted in FIG. 3B. Word lines WL1, WL3, and WL5 are shared between memory arrays 352 and 354 and controlled by row decoder 349 depicted in FIG. 3A. Word lines WL0, WL2, WL4, and WL6 are driven from the left side of memory array 352 and controlled by row decoder 348 depicted in FIG. 3A. Word lines WL1, WL3, and WL5 are driven from the right side of memory array 352 and controlled by row decoder 349 depicted in FIG. 3A. Bit lines BL0, BL2, and BL4 are driven from the bottom of memory array 352 and controlled by column decoder 346 depicted in FIG. 3A. Bit lines BL1, BL3, and BL5 are driven from the top of memory array 352 and controlled by column decoder 344 depicted in FIG. 3A.

Figure 3C:
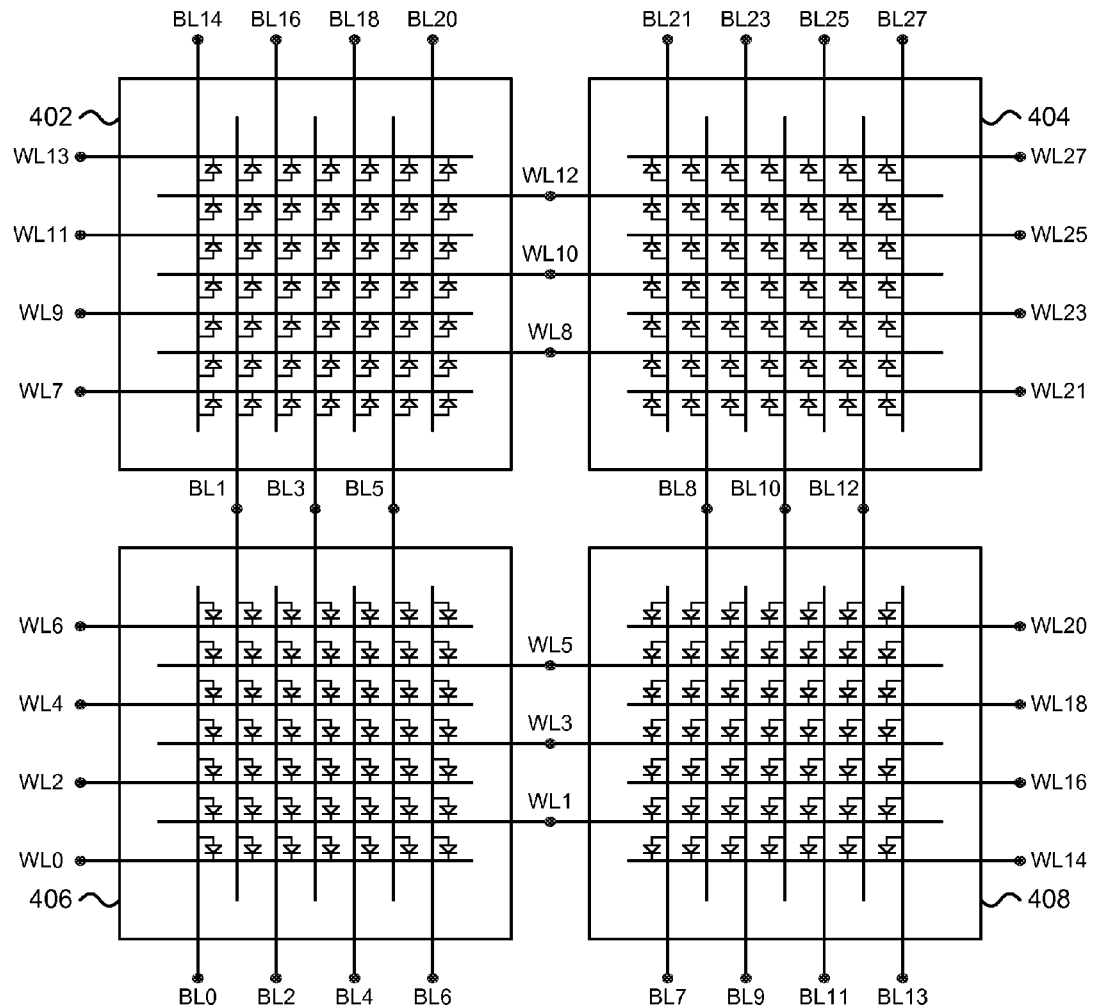
FIG. 3C is a simplified schematic diagram of one embodiment where word lines and bit lines are shared between memory arrays.

FIG. 3C depicts an arrangement of memory arrays wherein word lines and bit lines are shared across memory blocks and row decoders and column decoders are split. Word lines WL1, WL3, and WL5 are shared between memory arrays 406 and 408. Bit lines BL1, BL3, and BL5 are shared between memory arrays 406 and 402. Sharing word lines and/or bit lines helps to reduce layout area since a single row decoder and/or column decoder can be used to support two memory arrays. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders helps to relieve layout constraints (e.g., the column decoder pitch can be relieved by 2× since the split column decoders need only drive every other bit line instead of every bit line).

Figure 4A:
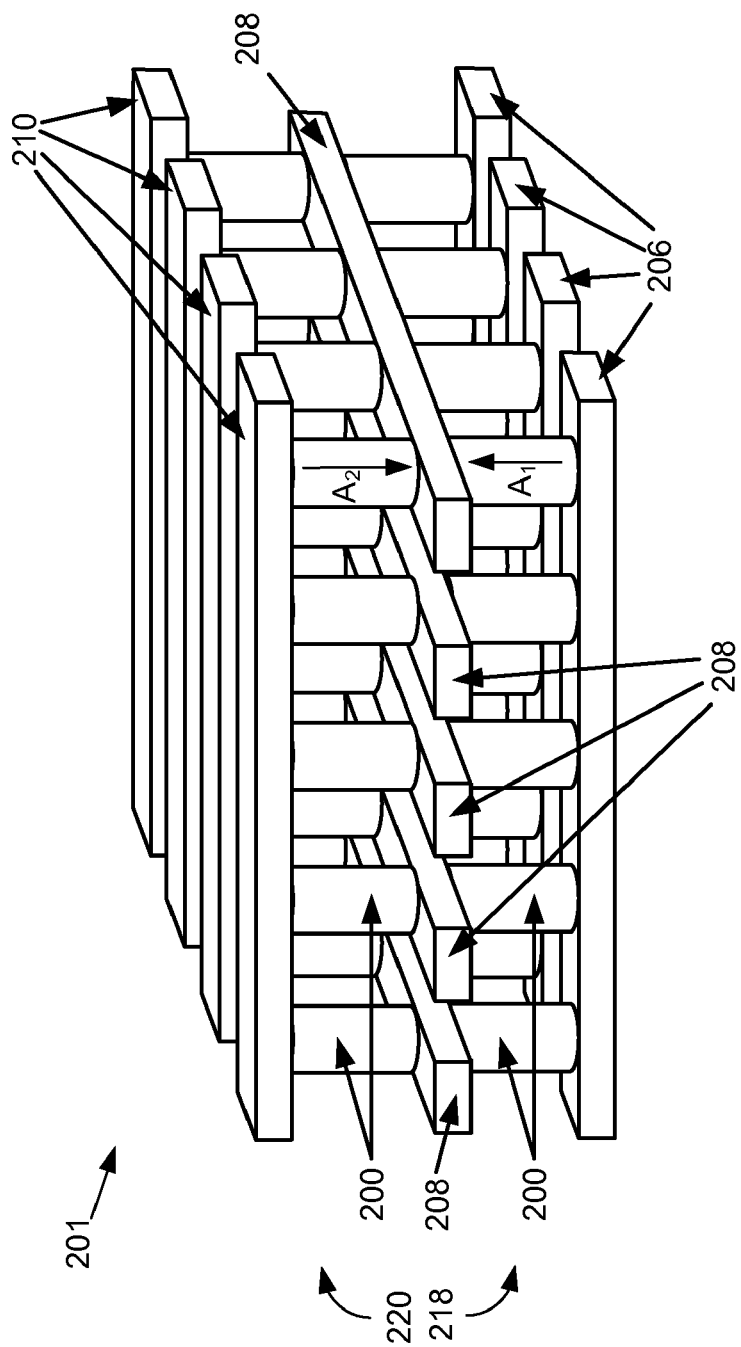
FIG. 4A is a simplified perspective view of a portion of a three-dimensional memory array.

The memory block 310 depicted in FIG. 2C may comprise two-dimensional or three-dimensional memory arrays. FIG. 4A is a simplified perspective view of a portion of a monolithic three-dimensional memory array 201 that includes a first memory level 218 positioned below a second memory level 220. The bit lines 206 and 210 are arranged in a first direction and the word lines 208 are arranged in a second direction perpendicular to the bit lines. The upper conductors of first memory level 218 may be used as the lower conductors of the second memory level 220 that is positioned above the first memory level. In a memory array with additional layers of memory cells, there would be additional layers of bit lines and word lines. In some embodiments, the memory levels may be formed as described in U.S. Pat. No. 6,952,030, "High-Density Three-Dimensional Memory Cell," which is hereby incorporated by reference herein in its entirety. Information regarding suitable embodiments of three-dimensional memories can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279.

Memory array 201 includes a plurality of memory cells 200. The memory cells 200 can be write-once memory cells or re-writeable memory cells. With respect to first memory level 218, memory cells 200 are between and connect to a set of bit lines 206 and a set of word lines 208. With respect to second memory level 220, memory cells 200 are between and connect to a set of bit lines 210 and word lines 208. In one embodiment, each memory cell includes a steering element (e.g., a diode) and a state change element. In one embodiment, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. Many different types of memory cells can be used.

In one embodiment, the memory cells 200 are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistivity-switching material having a resistivity that may be reversibly switched between two or more states. In some embodiments, the reversible resistance-switching material may be formed from a metal oxide. Various different metal oxides can be used. In one example, nickel oxide is used. Examples of various memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377. No particular type of memory cell is required to implement the memory block switching technique disclosed herein.

In one embodiment of a read operation, the data stored in one of the plurality of memory cells 200 is read by biasing one of the set of word lines (i.e., the selected word line) to the selected word line voltage in read mode (e.g., 0V). A read circuit is used to bias the bit line connected to the selected memory cell to the selected bit line voltage in read mode (e.g., 2V). For purposes of this document, a connection can be a direct connection or an indirect connection (e.g., via another part). To avoid sensing leakage current from the selected bit line to many unselected word lines, the unselected word lines are biased to the same voltage as the selected bit lines (e.g., 2V). To avoid leakage current from the unselected bit lines to the selected word line, the unselected bit lines can be biased to the same voltage as the selected word line (e.g., 0V). The read circuit then senses the amount of current through the selected memory cell (e.g., by comparing, over time, the voltage of a precharged node connected to the selected memory cell with a reference voltage).

In another embodiment of a read operation, the selected word line is biased to –1.6V, the selected bit lines are biased to 0V, the unselected word lines are biased to 0V, and the unselected bit lines are biased to –1.6V. The read circuit then senses the amount of current conducted by the selected memory cell.

In one embodiment of a write operation, the process of switching the resistance of a memory cell element from a high-resistivity state to a low-resistivity state is referred to as SETTING the reversible resistance-switching element. The process of switching the resistance from the low-resistivity state to the high-resistivity state is referred to as RESETTING the reversible resistance-switching element. The high-resistivity state is associated with binary data "0" and the low-resistivity state is associated with binary data "1." In other embodiments, SETTING and RESETTING and/or the data encoding can be reversed. In some embodiments, the first time a resistance-switching element is SET requires a higher than normal voltage and is referred to as a FORMING operation.

In one embodiment of a write operation, the reversible resistance-switching material may be in an initial high-resistivity state upon fabrication that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state upon fabrication that is reversibly switchable to a high-resistance state upon application of the appropriate voltage(s) and/or current(s). When used in a memory cell, one resistance state may represent a binary data "0" while another resistance state may represent a binary data "1." However, more than two data/resistance states may be used.

In one embodiment of a write operation, the resistance-switching element of one of a plurality of memory cells 200 is SET by biasing the selected word line to the selected word line voltage in SET mode (e.g., –0.6V). A write circuit is used to bias the bit line connected to the selected memory cell to the selected bit line voltage in SET mode (e.g., 7.4V). Therefore, the selected memory cell in SET mode is forward biased, similar to a read operation except with a larger voltage range. The unselected word lines are biased to 6.8V and the unselected bit lines are biased to 0V. Placing a voltage of 6.8V across the unselected memory cells associated with the intersection of unselected word lines and unselected bit lines reduces the amount of leakage current through the unselected memory cells, as compared to placing the 8V found across the selected memory cell. Other SET biasing schemes can also be used (e.g., placing a voltage of 5V across the selected memory cell, rather than 8V).

In one embodiment of a write operation, the resistance-switching element of one of a plurality of memory cells 200 is SET by biasing the selected word line to –8V, the selected bit lines to 0V, the unselected word lines to 0V, and the unselected bit lines to –8V.

In one embodiment of a write operation, the resistance-switching element of one of a plurality of memory cells 200 is RESET by biasing the selected word line to the selected word line voltage in RESET mode (e.g., 7V). A write circuit is used to bias the bit line connected to the selected memory cell to the selected bit line voltage in RESET mode (e.g., −7V). Therefore, the selected memory cell in RESET mode is reverse biased. The unselected word lines are biased to 0V and the unselected bit lines are biased to 0V. Biasing the unselected word lines and the unselected bit lines to the same voltage during a RESET operation reduces the amount of leakage current through the unselected memory cells, as compared to the SET operation described above.

Figure 4B:
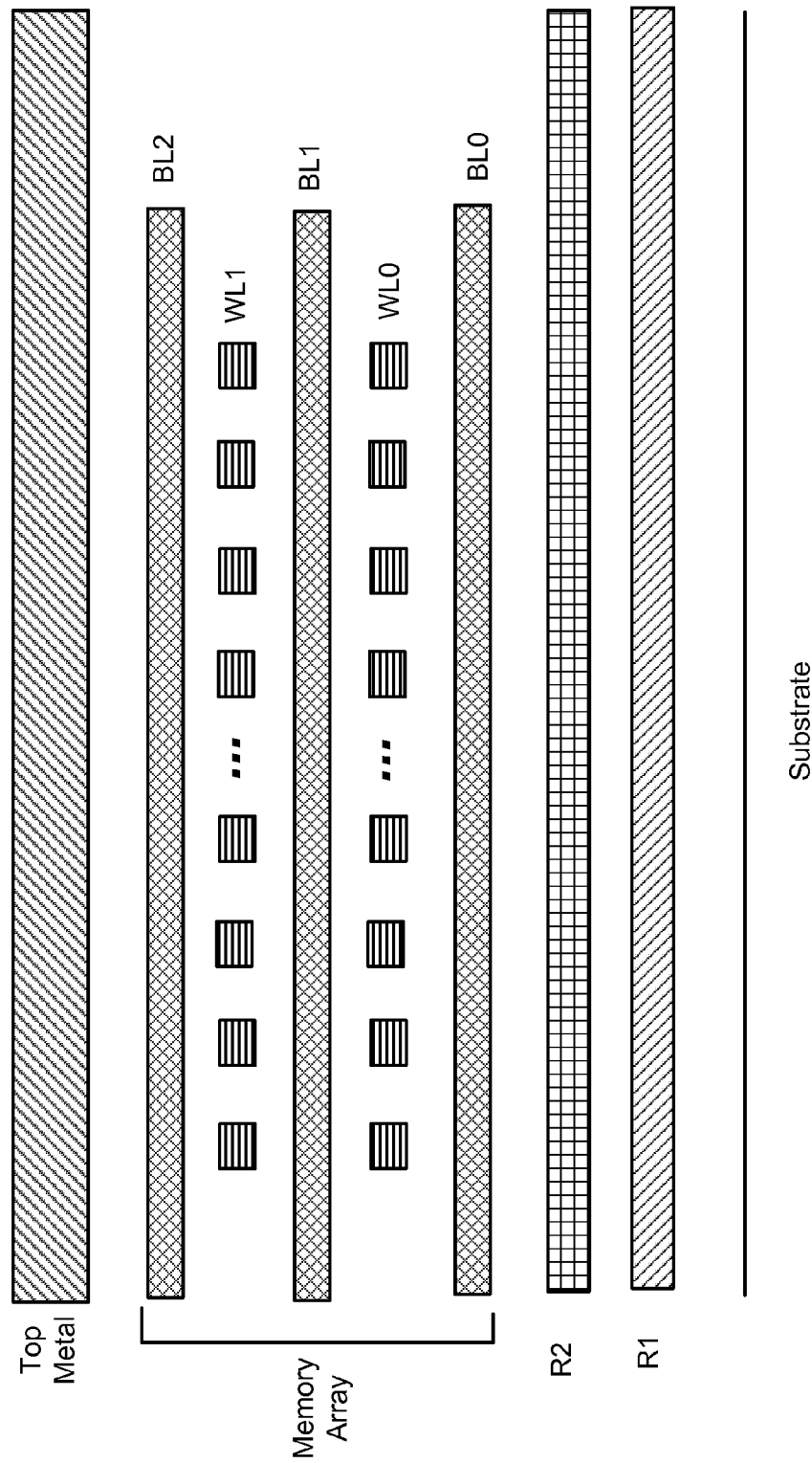
FIG. 4B depicts a subset of the layers of one embodiment of a three-dimensional memory.

FIG. 4B depicts a subset of the memory array and routing layers of one embodiment of a three-dimensional memory. The Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) is arranged on the surface of the Substrate with the Memory Array layers fabricated above the supporting circuitry. An integrated circuit implementing a three-dimensional memory may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

FIG. 4B depicts two metal layers R1 and R2 used for routing; however, other embodiments can include more or less than two metal layers. In one example, these metal layers R1 and R2 are formed of tungsten (about 1 ohm/square). Positioned above the Memory Array layers can be one or more metal layers used for routing signals between different components of the integrated circuit. FIG. 4B depicts one such metal layer above the memory array, labeled as the Top Metal layer. In one example, the Top Metal layer is formed of copper or aluminum (about 0.05 ohms/square), which may provide a smaller resistance per unit area than layers R1 and R2. Metals layers R1 and R2 may not be implemented using the same materials as those used for the Top Metal layers because the metal used for R1 and R2 needs to withstand the processing steps for fabricating the memory array on top of R1 and R2.

In one embodiment, a memory core 103, as depicted in FIG. 1, contains local data lines implemented in one or more lower metal layers below the Memory Array layers. The lower metal layers have a relatively higher resistance and capacitance per unit area. Global data lines are implemented in one or more Top Metal layers, which have relatively lower resistance and capacitance per unit area than the lower metal layers.

Vias can be used to make connections between adjacent routing layers. Multi-layer vias can be used to make connections between more than 2 layers. Information regarding multi-layer vias using less than one masking step per layer can be found in U.S. Pat. No. 6,034,882.

Though larger memory arrays are more area efficient, their size may be limited for a variety of reasons. For example, the signal delays traversing down word lines and bit lines which arise from the resistance and the capacitance of such lines (i.e., the RC delays) may be very significant in a large array. These RC delays may be reduced by subdividing the larger array into a group of smaller sub-arrays so that the length of each word line and/or each bit line is reduced. As another example, the power associated with accessing a group of memory cells may dictate an upper limit to the number of memory cells which may be accessed simultaneously during a given memory operation. Consequently, a large memory array may be subdivided into smaller sub-arrays to decrease the number of memory cells which are simultaneously accessed.

Figure 5:
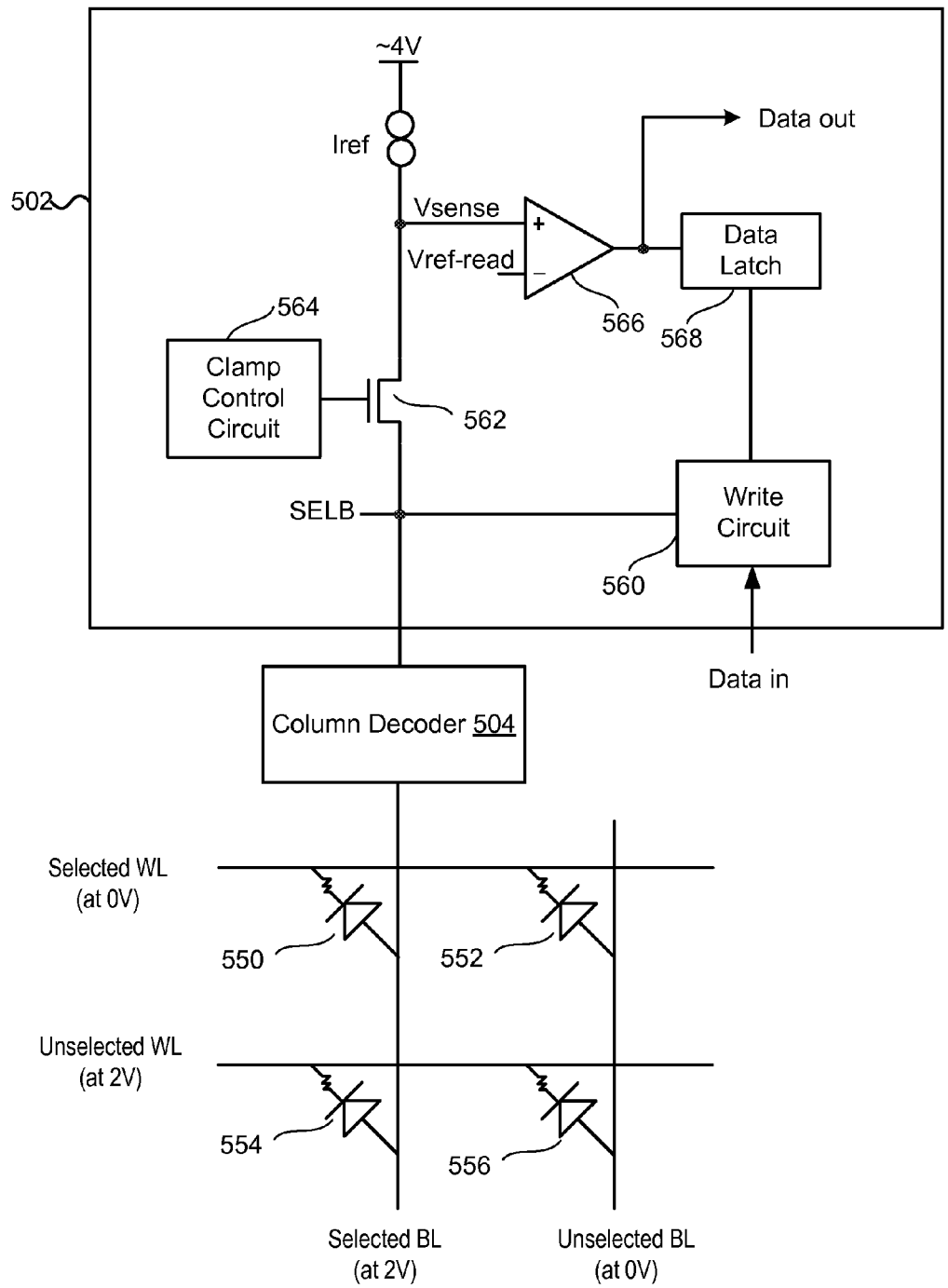
FIG. 5 depicts a circuit that can read or write the state of a memory cell.

FIG. 5 depicts one example of a read/write circuit 502 being operated in a read mode along with a portion of a memory array. Read/write circuit 502 corresponds to one of a group of read/write circuits 306 depicted in FIG. 2B. Read/write circuit 502 also corresponds to one of a group of read/write circuits 340 and 342 depicted in FIG. 3A. The portion of a memory array includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The selected bit line and unselected word line are biased to 2V. The selected word line and unselected bit line are biased to 0V. Selected memory cell 550 is forward biased by 2V. Unselected memory cell 556 is reverse biased by 2V. Half-selected memory cells 552 and 554 are neither forward nor reverse biased since they each have the same voltage applied to both ends of the memory cell.

Referring to the read/write circuit depicted in FIG. 5, the SELB node of read/write circuit 502 is electrically coupled to the selected bit line via column decoder 504. Column decoder 504 corresponds to column decoder 302 depicted in FIG. 2C. Transistor 562 couples node SELB to the Vsense node. Clamp control circuit 564 controls transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the data in terminal, and data latch 568.

During the read operation, read/write circuit 502 biases the selected bit line to 2V (i.e., the selected bit line voltage in read mode). Prior to sensing data, read/write circuit 502 will precharge the Vsense node to 4V. When sensing data, read/write circuit 502 attempts to regulate the SELB node to 2V via clamp control circuit 564 and transistor 562 in a source-follower configuration. If the current through the selected memory cell 550 is greater than the read current limit, Iref, then, over time, the Vsense node will fall below Vref-read (e.g., set to 3V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 will latch the output of sense amplifier 566 after a time period of sensing the current through the selected memory cell (e.g., 400 ns).

In one embodiment, during a write operation, if the data in terminal requests a data "0" to be written to a selected memory cell, then read/write circuit 502 biases SELB to the selected bit line voltage in write mode (e.g., 7.4V for a SET operation) via write circuit 560. The duration of programming the memory cell can be a fixed time period (e.g., using a fixed-width programming pulse) or variable (e.g., using a write circuit 560 that senses whether a memory cell has been programmed while programming). Information regarding write circuits that can sense while programming data can be found in U.S. Pat. No. 6,574,145. If the data in terminal requests a data "1" to be written, then write circuit 560 biases SELB to the unselected bit line voltage in write mode (e.g., 0V for a SET operation).

Figure 6:
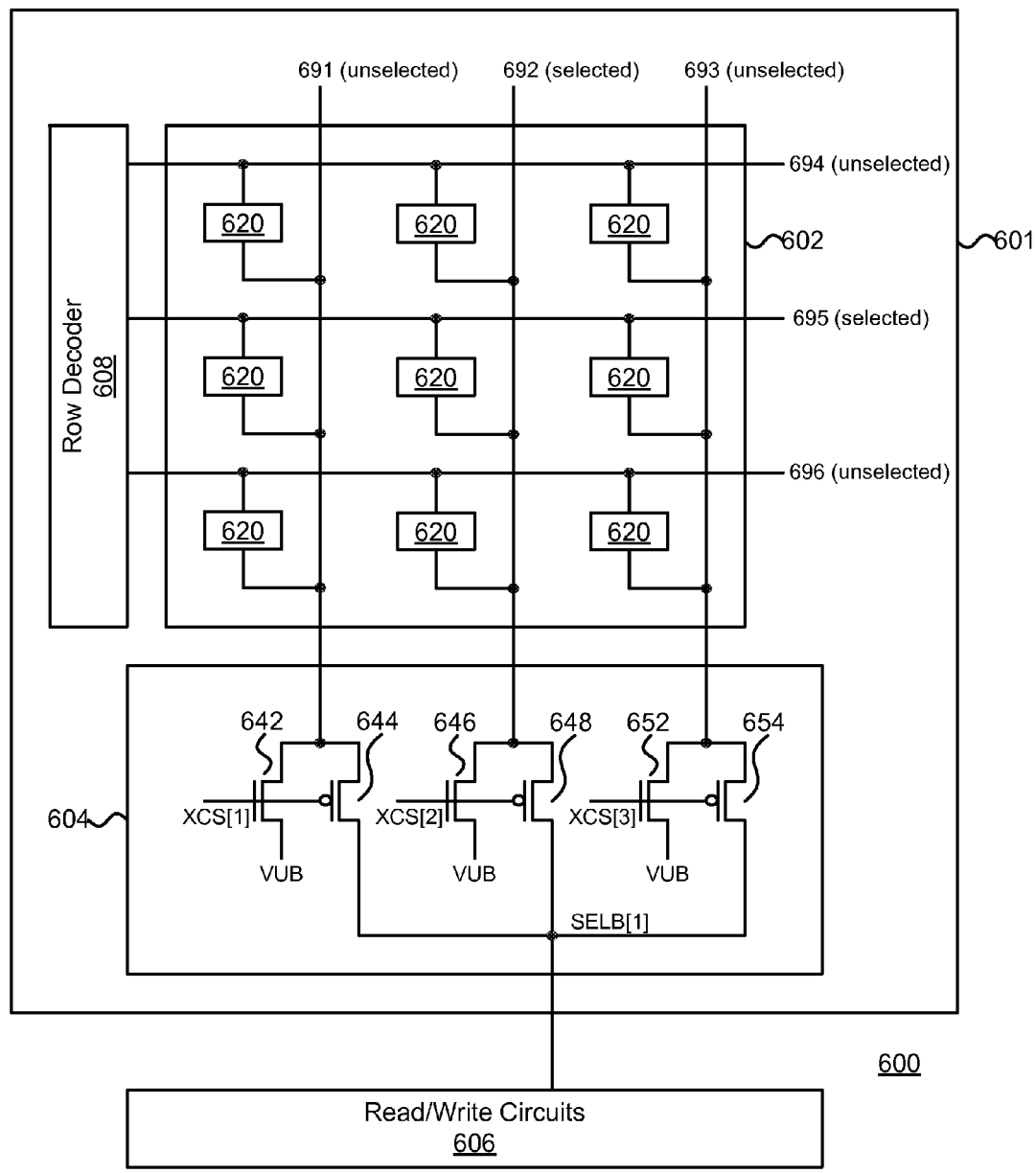
FIG. 6 depicts one embodiment of a memory bay including a memory block in an active state.

FIG. 6 depicts a memory bay 600 including a memory block in an active state. Memory bay 600 includes read/write circuits 606 and memory block 601 comprising memory array 602, row decoder 608, and column decoder 604. Memory array 602 includes word lines 694-696, bit lines 691-693, and memory cells 620 which can either be one-time or many-time programmable memory cells. Row decoder 608 connects to a set of word lines including one selected word line 695 and two unselected word lines 694 and 696 of memory array 602. Column decoder 604 connects to a set of bit lines including one selected bit line 692 and two unselected bit lines 691 and 693 of memory array 602. The selected bit line 692 connects to a bit line decoder formed by transistors 646 and 648 and controlled by node XCS[2]. The left unselected bit line 691 connects to a bit line decoder formed by transistors 642 and 644 and controlled by node XCS[1]. The right unselected bit line 693 connects to a bit line decoder formed by transistors 652 and 654 and controlled by node XCS[3]. The PMOS transistors 644, 648, and 654 connect to node SELB[1], which is connected to read/write circuits 606. The NMOS transistors 642, 646, and 652 connect to node VUB.

In one embodiment, when memory array 602 is in an active state, row decoder 608 selects a single word line and column decoder 604 selects a single bit line (i.e., XCS[2] is low, while XCS[1] and XCS[3] are high). When memory array 602 is active, column decoder 604 electrically couples the selected bit line 692 to the SELB[1] node, which is connected to read/write circuits 606. Column decoder 604 also biases the unselected bit lines 691 and 693 to VUB, the unselected voltage for bit lines. Though the depicted portion of column decoder 604 only selects one bit line per memory block 601, more than one bit line per memory block 601 may be selected. In one embodiment, column decoder 604 selects 32 bit lines per memory block. For example, column decoder 604 controls 32 subsets of bit lines and electrically couples one bit line from each of the 32 subsets of bit lines to a SELB node (i.e., to one of SELB[31:0]). In one embodiment, unselected bit lines may be biased to one or more unselected bit line voltages (e.g., in a read operation, the one or more unselected bit line voltages may include −1.6V, −1.5V, and −1.7V). In another embodiment, unselected word lines may be biased to one or more unselected word line voltages (e.g., in a SET operation, the one or more unselected word line voltages may include 6.8V, 6.7V, and 6.9V).

In one embodiment, when memory array 602 is in an inactive state, row decoder 608 biases all word lines (i.e., there is no selected word line) to an unselected word line voltage. Column decoder 604 biases all bit lines (i.e., there is no selected bit line) to an unselected bit line voltage. In another embodiment, row decoder 608 floats all word lines and column decoder 604 floats all bit lines. In one embodiment, memory bay 600 includes 16 memory blocks, one of the 16 memory blocks is in an active state and the other 15 memory blocks are in an inactive state.

Figure 7A:
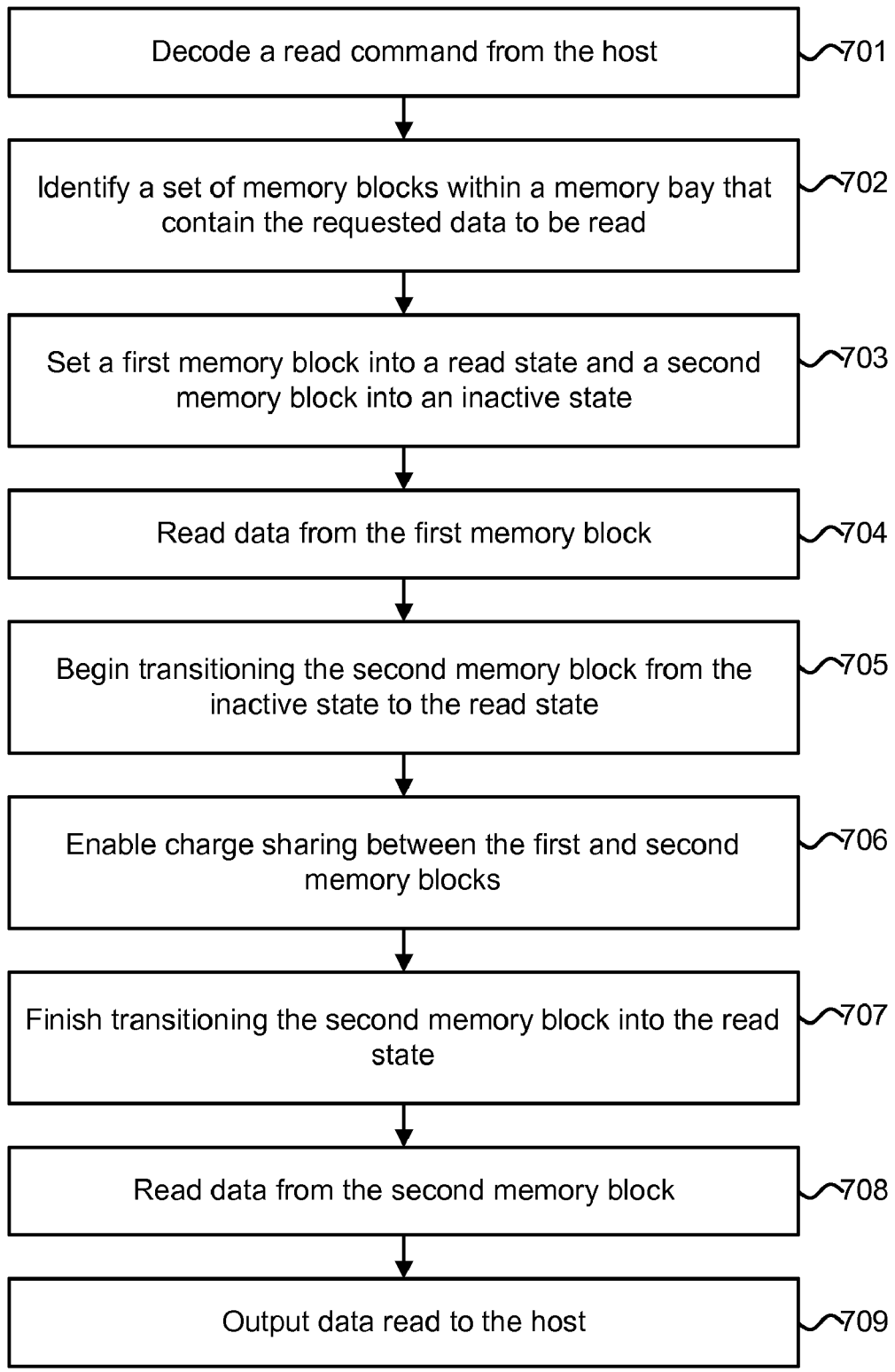
FIG. 7A is a flow chart describing one embodiment of a process for implementing a memory block switching technique during a read operation.

FIG. 7A is a flow chart of one embodiment of a process for implementing a memory block switching technique during a read operation. The process of FIG. 7A can be performed on one memory bay or on multiple memory bays concurrently. In step 701, a read command from the host is decoded by the memory chip controller 105 depicted in FIG. 1. In step 702, a memory bay and set of memory blocks within the memory bay are identified that contain the requested data to be read. Besides identifying the set of memory blocks associated with the data to be read, memory chip controller 105 may also determine the order of memory block activation. In step 703, within the memory bay, a first memory block is set into a read state and a second memory block is set into an inactive state. In step 704, data is read from the first memory block and stored in a page register. In one embodiment, the page register is physically located under the Memory Array layers depicted in FIG. 4B. In another embodiment, the page register is physically located outside the memory core 103 depicted in FIG. 1. In step 705, the second memory block begins transitioning from the inactive state to the read state and the first memory block begins transitioning from the read state to the inactive state. In step 706, charge sharing is enabled between the first and second memory blocks. During this step, one set of control lines (e.g., bit lines or word lines) associated with the first memory block are electrically coupled with a second set of control lines associated with the second memory block. In step 707, the second memory block finishes transitioning from the inactive state to the read state and the first memory block finishes transitioning from the read state to the inactive state. In step 708, data is read from the second memory block and stored in the page register. In step 709, the data read from the first and second memory blocks is output to the host by memory chip controller 105. Note that other orders of steps, in addition to what is depicted in FIG. 7A, can also be used.

Figure 7B:
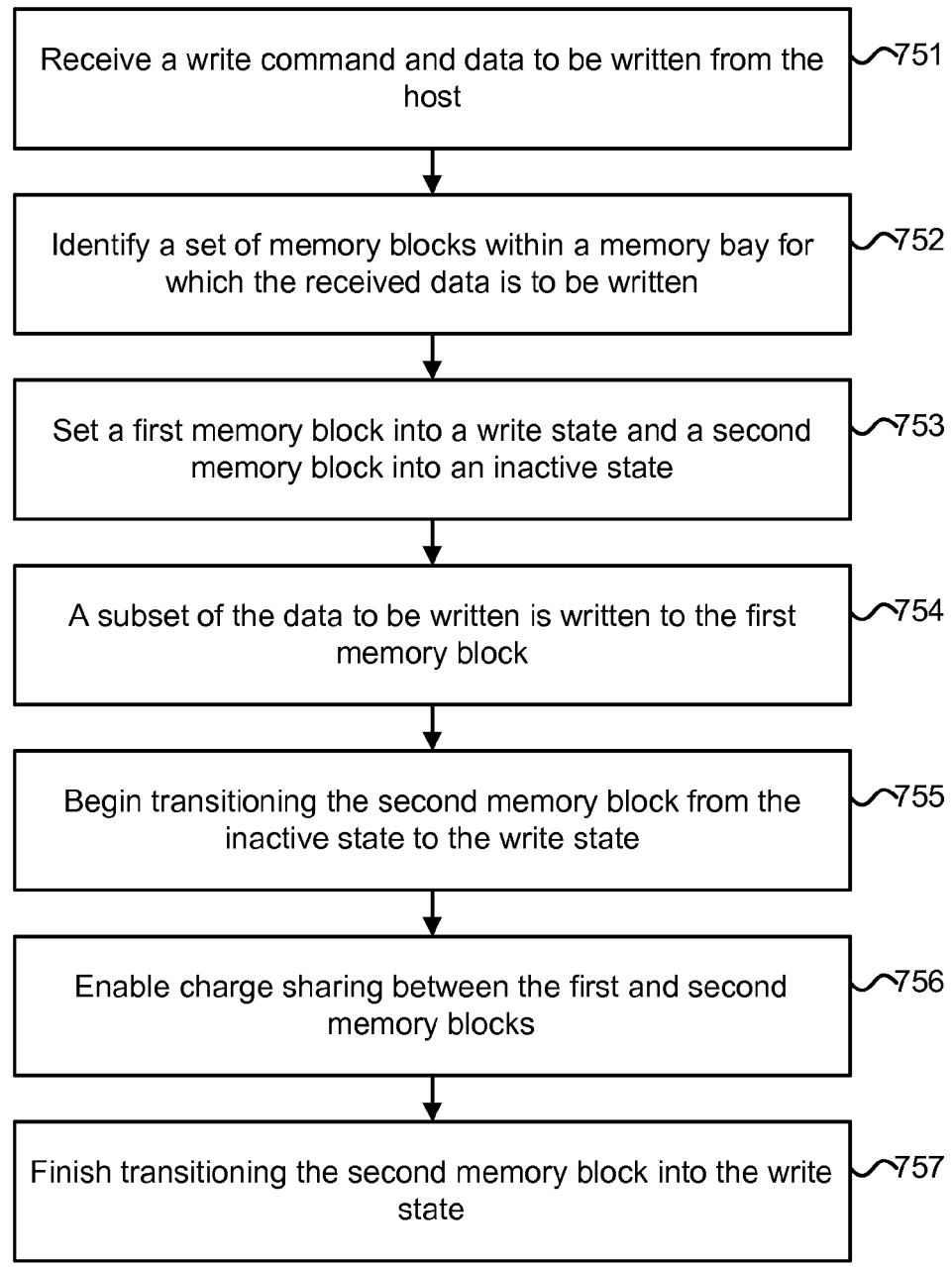
FIG. 7B is a flow chart describing one embodiment of a process for implementing a memory block switching technique during a write operation.

FIG. 7B is a flow chart of one embodiment of a process for implementing a memory block switching technique during a write operation. The process of FIG. 7B can be performed on one memory bay or on multiple memory bays concurrently. In step 751, a write command and data to be written are received from a host. The write command from the host is decoded by the memory chip controller 105 depicted in FIG. 1. In step 752, a memory bay and set of memory blocks within the memory bay are identified for which the received data is to be written. In step 753, within the memory bay, a first memory block is set into a write state (e.g., a write state for performing a SET or RESET operation) and a second memory block is set into an inactive state. In step 754, a subset of the data to be written is written to the first memory block. In step 755, the second memory block begins transitioning from the inactive state to the write state and the first memory block begins transitioning from the write state to the inactive state. In step 756, charge sharing is enabled between the first and second memory blocks. During this step, one set of control lines (e.g., bit lines or word lines) associated with the first memory block are electrically coupled with a second set of control lines associated with the second memory block. In step 757, the second memory block finishes transitioning from the inactive state to the write state and the first memory block finishes transitioning from the write state to the inactive state. Note that other orders of steps, in addition to what is depicted in FIG. 7B, can also be used.

Figure 8:
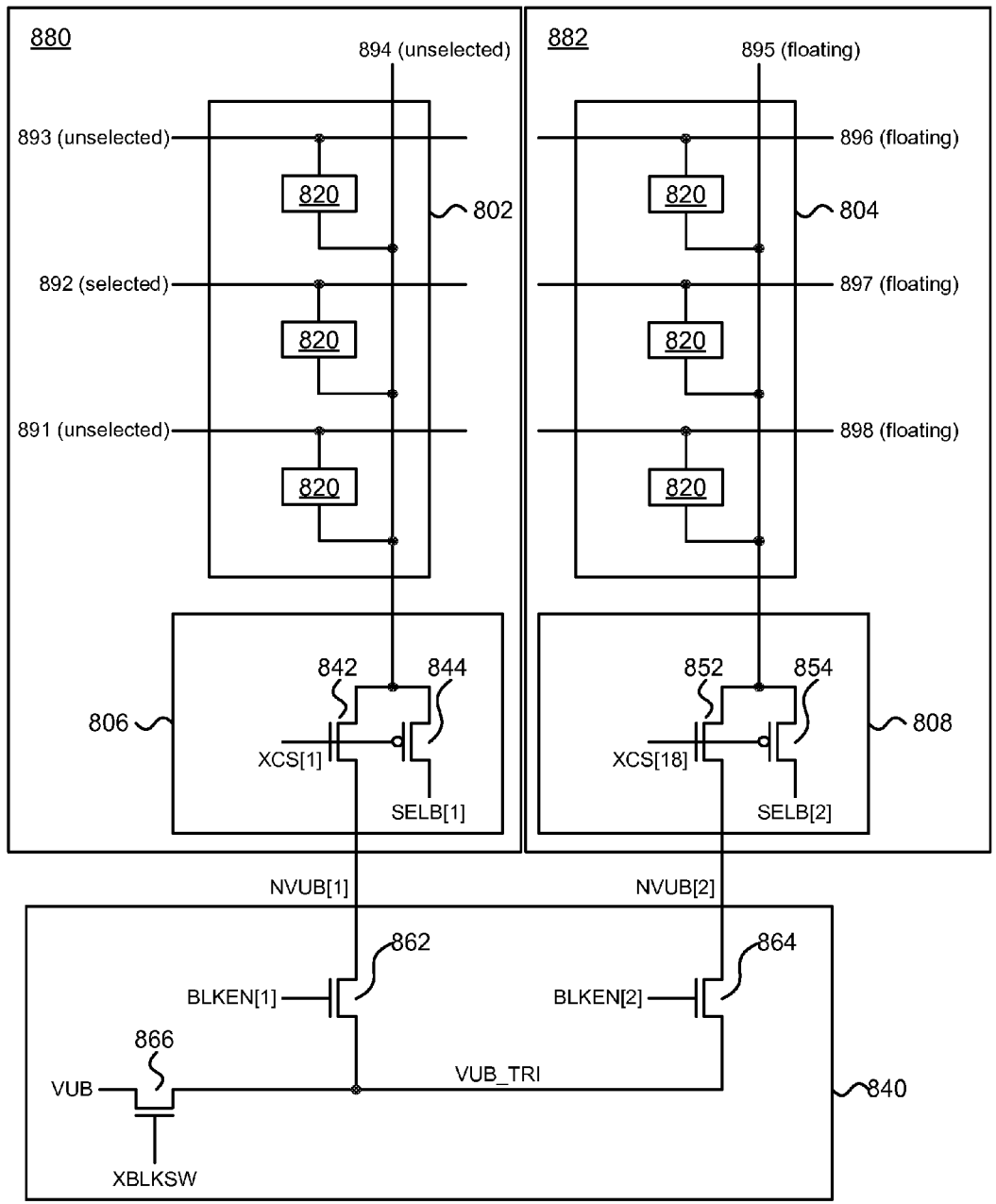
FIG. 8 depicts one embodiment of a portion of a memory bay for implementing a memory block switching technique.

FIG. 8 depicts one embodiment of a portion of memory bay 800 for implementing a memory block switching technique. Portion of memory bay 800 includes a portion of a first block 880, a portion of a second block 882, and a charge transfer circuit 840. Portion of a first block 880 includes a portion of first memory array 802 and a portion of a first column decoder 806. The first memory array 802 includes two unselected word lines 891 and 893, a selected word line 892, an unselected bit line 894, and memory cells 820 which can either be one-time or many-time programmable memory cells. As depicted in FIG. 8, memory cells 820 are placed at the intersection of word lines 891-893 and the unselected bit line 894 in first memory array 802. Portion of a first column decoder 806 includes a bit line decoder formed by transistors 842 and 844 and controlled by node XCS[1]. A full column decoder comprises a plurality of bit line decoders. The unselected bit line 894 in first memory array 802 connects to the bit line decoder formed by transistors 842 and 844. The PMOS transistor 844 couples node SELB[1] to the unselected bit line 894 in first memory array 802. The NMOS transistor 842 couples node NVUB[1] to the unselected bit line 894 in first memory array 802.

Portion of a second block 882 includes a portion of second memory array 804 and a portion of a second column decoder 808. The second memory array 804 includes word lines 896-898, a bit line 895, and memory cells 820 which can either be one-time or many-time programmable memory cells. As depicted in FIG. 8, memory cells 820 are placed at the intersection of word lines 896-898 and bit line 895 in second memory array 804. Bit line 895 is floated when second memory array 804 is in an inactive state. Portion of a second column decoder 808 includes a bit line decoder formed by transistors 852 and 854 and controlled by node XCS[18]. The bit line 895 in second memory array 804 connects to the bit line decoder formed by transistors 852 and 854. The PMOS transistor 854 couples node SELB[2] to bit line 895 in second memory array 804. The NMOS transistor 852 couples node NVUB[2] to bit line 895 in second memory array 804.

In one embodiment, first memory array 802 and second memory array 804 include a plurality of word lines and a plurality of bit lines. In another embodiment, portion of a first column decoder 806 and portion of a second column decoder 808 comprise a plurality of bit line decoders. The word lines 896-898 of second memory array 804 may be biased to an unselected word line voltage or floated. The bit line 895 of second memory array 804 may be biased to an inactive unselected voltage (e.g., 0V) or floated. Referring to FIG. 3C, since WL3 is shared between memory arrays 406 and 408, if memory array 406 is in an active state and memory array 408 is in an inactive state, then WL3 may be biased to the unselected word line voltage. Similarly, unselected word lines 891 and 893 may be shared by both first memory array 802 and second memory array 804.

Charge transfer circuit 840 includes NMOS transistors 866, 862, and 864. NMOS transistor 866 couples node VUB, biased to the unselected bit line voltage, to node VUB_TRI, which is a node that can either be biased to a particular voltage or floated. NMOS transistor 862 couples node NVUB[1] to VUB_TRI and is controlled by BLKEN[1]. NMOS transistor 864 couples node NVUB[2] to VUB_TRI and is controlled by BLKEN[2]. NMOS transistor 866 couples node VUB to VUB_TRI and is controlled by XBLKSW.

During a memory operation, first memory array 802 is initially in an active state with its unselected bit lines biased to an unselected bit line voltage. Second memory array 804 is initially in an inactive state with its bit lines floating. The process of transitioning the second memory array 804 into the active state includes turning off transistor 866 and turning on transistors 862 and 864 at the same time. Turning on transistors 862 and 864 at the same time creates a conductive path between nodes NVUB[1] and NVUB[2]. Along with portion of column decoder 806 selecting NVUB[1] for its unselected bit lines and portion of column decoder 808 selecting NVUB[2] for its unselected bit lines, a conductive path between the unselected bit lines in first memory array 802 and the unselected bit lines in second memory array 804 is formed and charge sharing occurs. After charge sharing occurs, first memory array 802 is placed into the inactive state and second memory array 804 is placed into the active state.

Figure 9A:
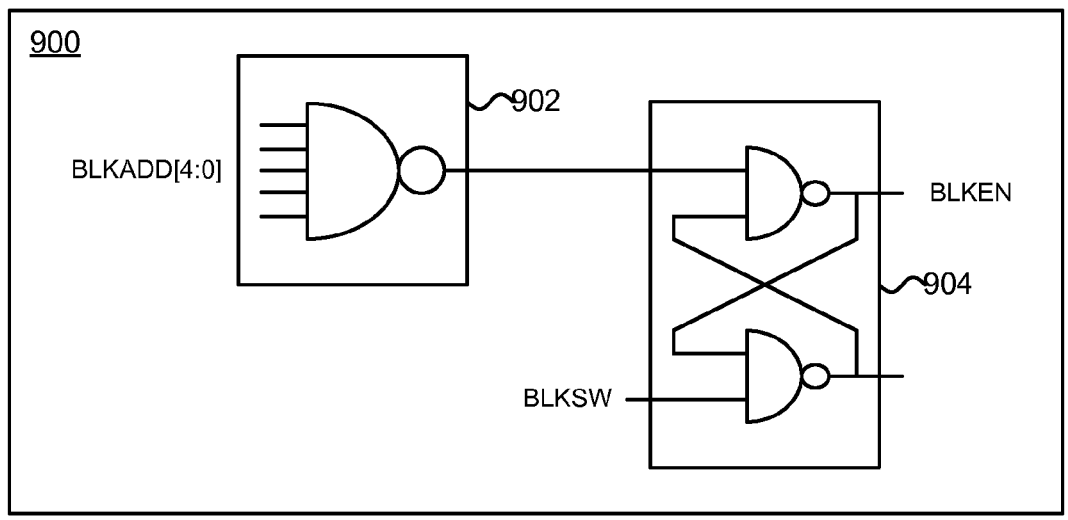
FIG. 9A is a simplified schematic diagram of one embodiment of a circuit for generating a memory block enable signal.

FIG. 9A depicts one embodiment of a BLKEN latching circuit 900 for generating the block enable signals (e.g., BLKEN[1] and BLKEN[2]) used as inputs to charge transfer circuit 840 depicted in FIG. 8. Block decoder 902, including a NAND gate, takes block address BLKADD[4:0] as an input and its output is coupled to one input of latch 904. Latch 904, formed by a pair of cross-coupled NAND gates, outputs a block enable signal, BLKEN, and includes a second input coupled to BLKSW. If BLKSW is raised before the memory block address BLKADD[4:0] changes, then BLKEN will be held high until BLKSW is lowered. In the embodiment of FIG. 9A, the BLKEN latching circuit 900 will cause BLKEN to go high when BLKADD[4:0]=11111. In other embodiments, the block decoder 902 is configured such that BLKEN is driven high when a particular block address is given (e.g., BLKADD[4:0]=00010).

Figure 9B:
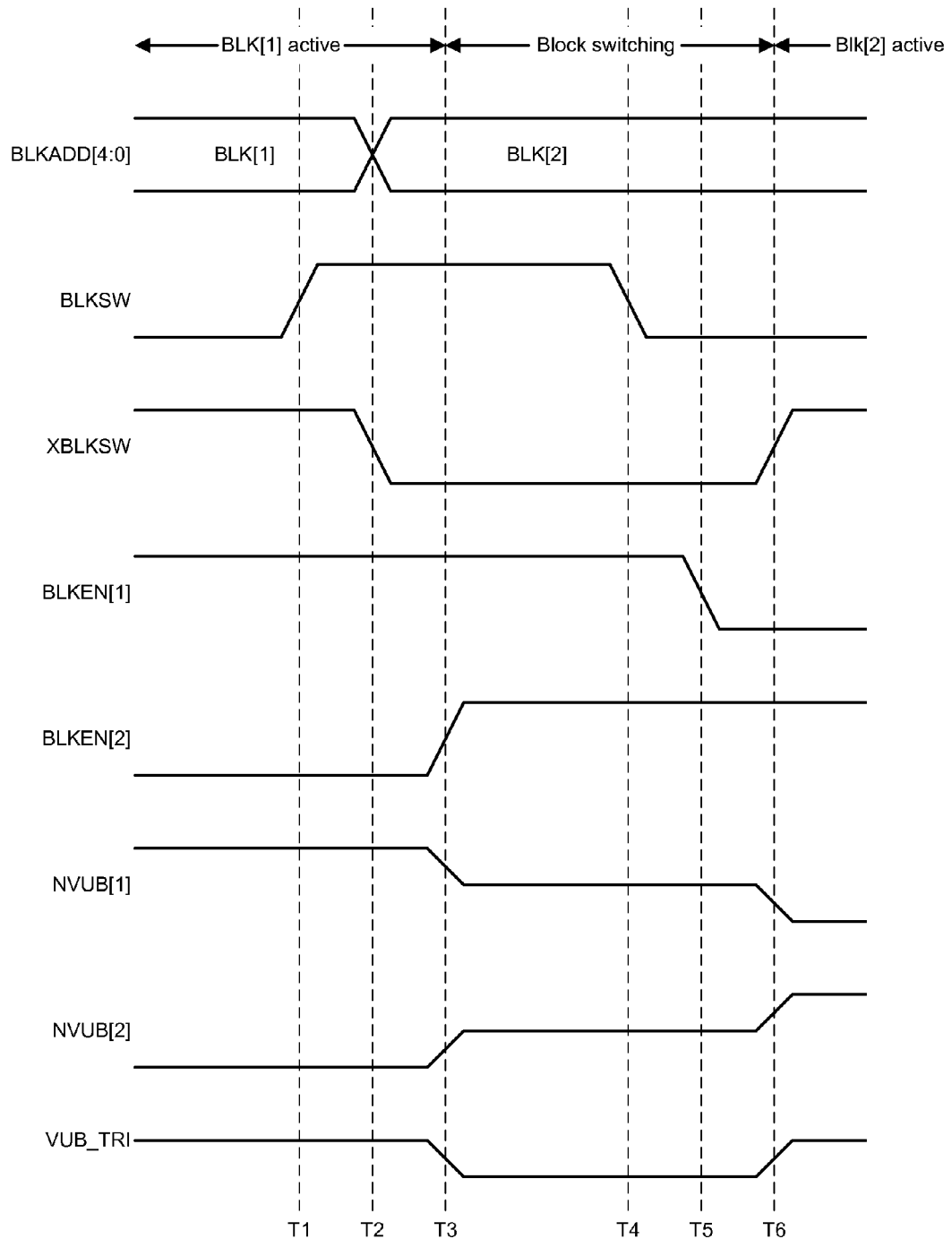
FIG. 9B is a timing diagram depicting one embodiment of a process for operating the circuits depicted in FIGS. 8 and 9A.

The timing diagram shown in FIG. 9B depicts one embodiment of a process for operating portion of memory bay 800 (See FIG. 8) and BLKEN latching circuit 900 (See FIG. 9). BLKADD[4:0] represents a given block address and is an input to the BLKEN latching circuit 900. BLKSW is an active-high block switch signal and is an input to the BLKEN latching circuit 900. XBLKSW is an active-low block switch signal and is an input to charge transfer circuit 840 depicted in FIG. 8. BLKEN[1] is the block enable for the first block, with block address BLK[1], and corresponds to portion of first block 880 depicted in FIG. 8. BLKEN[2] is the block enable signal for the second block, with block address BLK[2], and corresponds to portion of second block 882 depicted in FIG. 8. NVUB[1], as shown in FIG. 8, is the NVUB node for the first block. NVUB[2], as shown in FIG. 8, is the NVUB node for the second block. VUB_TRI is the tri-stateable node that is connected to transistors 862, 864, and 866 in FIG. 8.

In one embodiment, the capacitance between unselected bit lines and unselected word lines in a first memory block in an active state is several nanofarads. Referring to FIG. 3C, if memory array 406 is part of the first memory block that is in the active state, then the energy stored in the capacitances connected to the unselected bit lines further includes those capacitances related to sharing bit lines with memory array 402 (e.g., bit lines BL1, BL3, and BL5 may capacitively couple to word lines WL7-WL13 and/or bit lines BL14, BL16, BL18, and BL20). Therefore, a significant amount of energy is stored by the first memory block in the active state. Since a significant amount of energy is required to charge up the unselected bit lines in a second memory block when transitioning from an inactive state to an active state, the energy stored by the first memory block can used to help charge up the second memory block. A memory block switching technique that allows charge sharing between the unselected bit lines in a first memory block and the unselected bit lines in a second memory block, which is transitioning from an inactive state to an active state, may be used to reduce energy consumption. The memory block switching technique may also improve performance and/or reduce power during the switching of one active memory block to another.

During a memory operation, first memory array 802, corresponding to portion of first block 880, is initially in an active state (e.g., in a read state or a write state) and its unselected bit lines are biased to the unselected voltage for bit lines. Second memory array 804, corresponding to portion of second block 882, is initially in an inactive state. As depicted in FIG. 9B, when the first block with block address BLK[1] is active prior to T1, BLKSW is low, XBLKSW is high, and BLKEN[1] is high. The unselected bit line shown in FIG. 8 is, therefore, biased to VUB since XCS[1], BLKEN[1], and XBLKSW are all high. At T1, the transitioning of the first block to the second block starts by setting BLKSW high which allows the latching of BLKEN[1] prior to the change in memory block address BLKADD[4:0] at T2. At T2, along with the change in memory block address, XBLKSW is set low, thereby floating VUB_TRI and preventing VUB from being electrically coupled to unselected bit lines. At T3, BLKEN[2] rises and the memory block enable signals BLKEN[1] and BLKEN[2] are overlapped. Along with portion of column decoder 806 selecting NVUB[1] for its unselected bit lines and portion of column decoder 808 selecting NVUB[2] for its unselected bit lines, a conducting path between the unselected bit lines in the first block and the unselected bit lines in the second block is formed and charge sharing occurs. The charge sharing enabled by the electrical coupling of unselected control lines in the first block and unselected control lines in the second block corresponds to step 706 in FIG. 7. The charge sharing sends the voltage at node NVUB[1] lower and the voltage at node NVUB[2] higher. At time T4, BLKSW falls causing BLKEN[1] to fall at T5, thereby preventing charge sharing between the first and second blocks. At time T6, XBLKSW rises causing NVUB[2] to be biased to VUB. NVUB[1] is pulled lower through a discharge path not shown in FIG. 8.

Referring to FIG. 9B, BLKSW is raised at T1, a time prior to the change in memory block address at T2. After the change in memory block address, BLKEN[2] goes high at T3 due to delay through the BLKEN latching circuit. Since BLKSW was raised prior to the change in block address, both BLKEN [1] and BLKEN[2] are high creating a charge sharing path between the unselected bit lines in the first and second memory blocks. To prevent any signal conflicts from occurring, XBLKSW falls at T2 prior to BLKEN[2] rising at T3, thereby floating VUB_TRI prior to charge sharing. Similarly, BLKEN[1] falls at T5 prior to XBLKSW rising.

Figure 10:
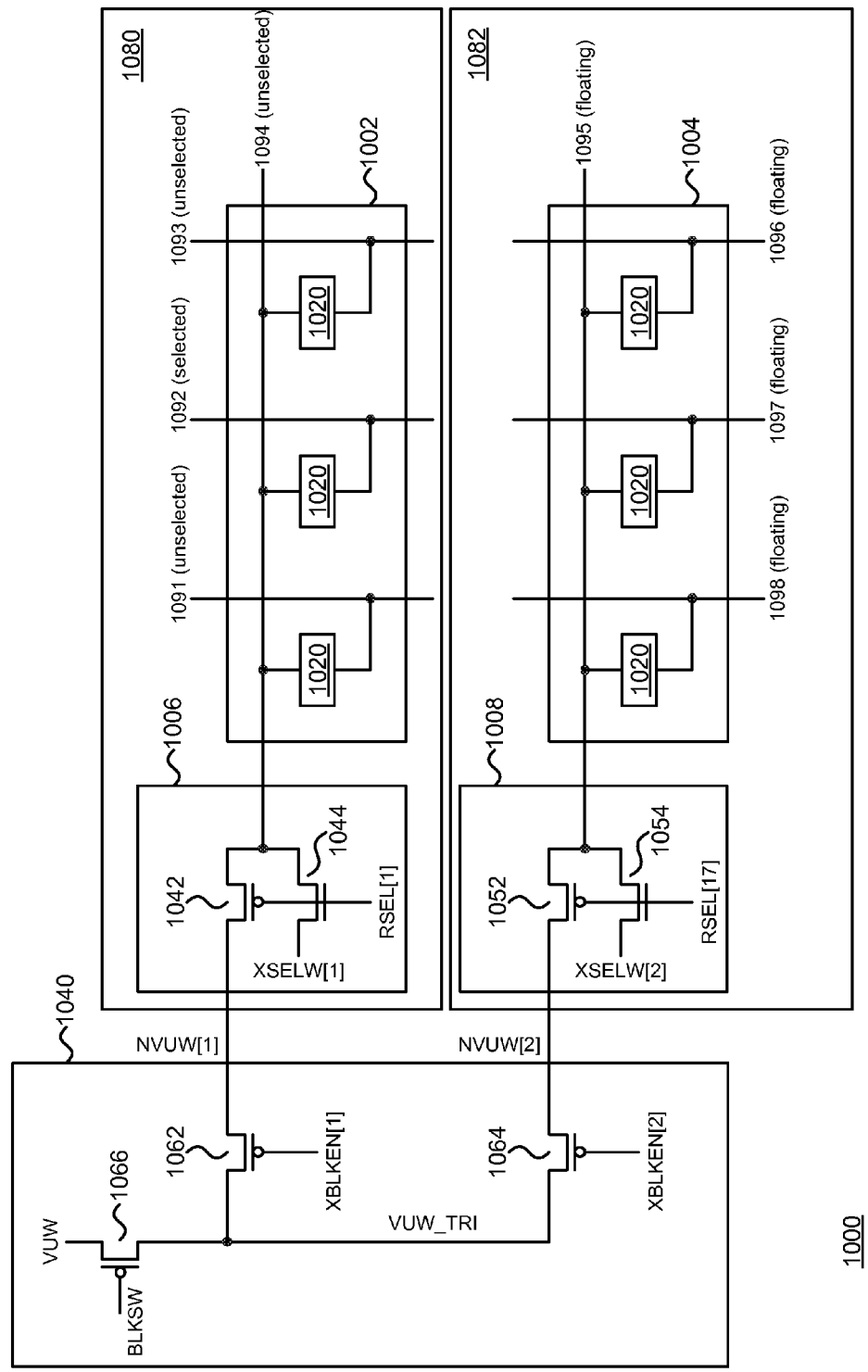
FIG. 10 depicts one embodiment of a portion of a memory bay for implementing a memory block switching technique.

FIG. 10 depicts a portion of memory bay 1000 for implementing a memory block switching technique. Portion of memory bay 1000 includes a portion of a first block 1080, a portion of a second block 1082, and a charge transfer circuit 1040. Portion of a first block 1080 includes a first memory array 1002 and a portion of a first row decoder 1006. The first memory array 1002 includes bit lines 1091-1093, an unselected word line 1094, and memory cells 1020 which can either be one-time or many-time programmable memory cells. Portion of a first row decoder 1006 includes a word line decoder formed by transistors 1042 and 1044 and controlled by node RSEL[1]. A full row decoder comprises a plurality of word line decoders. The NMOS transistor 1044 couples node XSELW[1] to unselected word line 1094 in first memory array 1002. The PMOS transistor 1042 couples node NVUW [1] to unselected word line 1094 in first memory array 1002.

Portion of a second block 1082 includes a second memory array 1004 and a portion of a second row decoder 1008. The second memory array 1004 includes bit lines 1096-1098, a word line 1095, and memory cells 1020 which can either be one-time or many-time programmable memory cells. Word line 1095 is floated when second memory array 1004 is in an inactive state. Portion of a second row decoder 1008 includes a word line decoder formed by transistors 1052 and 1054 and controlled by node RSEL[17]. The NMOS transistor 1054 couples node XSELW[2] to word line 1095 in second memory array 1004. The PMOS transistor 1052 couples node NVUW[2] to word line 1095 in second memory array 1004. In one embodiment, first memory array 1002 and second memory array 1004 include a plurality of word lines and a plurality of bit lines. In another embodiment, portion of a first row decoder 1006 and portion of a second row decoder 1008 comprise a plurality of word line decoders. The bit lines 1096-1098 of second memory array 1004 may be biased to an unselected bit line voltage or floated. The word line 1095 of second memory array 1004 may be biased to an inactive unselected voltage or floated. Referring to FIG. 3C, since BL3 is shared between memory arrays 406 and 402, if memory array 406 is in an active state and memory array 402 is in an inactive state, then BL3 may be biased to the unselected bit line voltage. Similarly, unselected bit lines 1091 and 1093 may be shared by both first memory array 1002 and second memory array 1004.

Charge transfer circuit 1040 includes PMOS transistors 1066, 1062, and 1064. PMOS transistor 1066 couples node VUW, biased to the unselected word line voltage, to node VUW_TRI, which is a node that can either be biased to a particular voltage or floated. PMOS transistor 1062 couples node NVUW[1] to VUW_TRI and is controlled by XBLKEN [1]. PMOS transistor 1064 couples node NVUW[2] to VUW_TRI and is controlled by XBLKEN[2]. PMOS transistor 1066 couples node VUW to VUW_TRI and is controlled by BLKSW.

During a memory operation, first memory array 1002, corresponding to portion of a first block 1080, is initially in an active state (e.g., in a read state or a write state) and its unselected word lines are biased to the unselected voltage for word lines. Second memory array 1004, corresponding to portion of a second block 1082, is initially in an inactive state. Charge transfer circuit 1040 can be operated in a fashion similar to that of charge transfer circuit 840 in FIG. 8 (described above) in order to allow charge sharing to occur between the consecutive activation of memory blocks. When BLKSW is high, VUW, the unselected voltage for word lines, is prevented from biasing VUW_TRI. Once both XBLKEN [1] and XBLKEN[2] are overlapped low, charge sharing will occur between the unselected word lines in memory arrays 1002 and 1004. Subsequently, XBLKEN[1] is raised and the electrical coupling of the unselected word lines in memory arrays 1002 and 1004 is prevented.

In one embodiment, memory arrays 1002 and 1004 depicted in FIG. 10 correspond to memory arrays 406 and 408 depicted in FIG. 3C, respectively. If memory array 406 is in an active state, then due to interleaving, roughly half of the word lines are already biased to the unselected word line voltage in memory array 408 since word lines WL1, WL3, and WL5 are shared by both memory arrays 406 and 408.

One embodiment includes setting a first group of non-volatile storage elements into an active state, setting a second group of non-volatile storage elements into an inactive state, each non-volatile storage element of a subset of the second group of non-volatile storage elements is coupled to one of a plurality of second control lines and transitioning the second group of non-volatile storage elements from the inactive state to the active state. The setting a first group of non-volatile storage elements into the active state includes biasing a plurality of first control lines to one or more unselected voltages. Each first control line is coupled to a subset of the first group of non-volatile storage elements. The transitioning includes sharing charge between the plurality of first control lines and the plurality of second control lines.

One embodiment includes decoding a read command from a host, identifying a set of memory blocks that contain the requested data to be read, setting a first memory block into a read state, setting a second memory block into an inactive state, and reading data from the first memory block. The embodiment further includes transitioning the first memory block into the inactive state and the second memory block into the read state, reading data from the second memory block, and outputting the data read to the host. The transitioning includes sharing charge between the first memory block and the second memory block.

One embodiment includes biasing a plurality of first control lines, each first control line is coupled to a respective subset of a first plurality of non-volatile storage elements, floating a plurality of second control lines, each second control line is coupled to a respective subset of a second plurality of non-volatile storage elements, and setting up read conditions for the second plurality of non-volatile storage elements. The setting up read conditions includes sharing charge between the plurality of first control lines and the plurality of second control lines.

One embodiment includes non-volatile storage elements including a first set of the non-volatile storage elements and a second set of the non-volatile storage elements, a plurality of first control lines, each first control line is coupled to a respective subset of the first set of non-volatile storage elements, a plurality of second control lines, each second control line is coupled to a respective subset of the second set of non-volatile storage elements, and a charge transfer circuit. The charge transfer circuit is coupled to both the plurality of first control lines and the plurality of second control lines. The charge transfer circuit comprises a first switch, the first switch controls charge sharing between the plurality of first control lines and the plurality of second control lines while setting up read conditions for the second set of non-volatile storage elements.

One embodiment includes a first memory block comprising a plurality of first control lines, the first memory block set into a read state, a second memory block comprising a plurality of second control lines, the second memory block set into an inactive state, and a charge transfer circuit coupled to both the plurality of first control lines and the plurality of second control lines. The charge transfer circuit controls charge sharing between the plurality of first control lines and the plurality of second control lines during a transitioning of the second memory block from the inactive state into the read state.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage system, comprising:
    setting a first group of non-volatile storage elements into an active state, said setting a first group of non-volatile storage elements into said active state includes biasing a plurality of first control lines to one or more unselected voltages, each first control line is coupled to a subset of said first group of non-volatile storage elements;
    setting a second group of non-volatile storage elements into an inactive state, each non-volatile storage element of a subset of said second group of non-volatile storage elements is coupled to one of a plurality of second control lines; and
    transitioning said second group of non-volatile storage elements from said inactive state to said active state, said transitioning includes sharing charge between said plurality of first control lines and said plurality of second control lines.

2. A method according to claim 1, further comprising:
    floating said plurality of second control lines when said second group of non-volatile storage elements is in said inactive state;
    reading data from said second group of non-volatile storage elements when said second group of non-volatile storage elements is in said active state; and
    outputting said data read to a host.

3. A method according to claim 1, wherein:
    said active state is a read state.

4. A method according to claim 1, wherein:
    said transitioning includes controlling a charge transfer circuit, said charge transfer circuit is coupled to both said plurality of first control lines and said plurality of second control lines, said charge transfer circuit comprises a switch, said transitioning includes turning off said switch during charge sharing to prevent the electrical coupling of said one or more unselected voltages to said plurality of first control lines.

5. A method according to claim 1, wherein:
    said first group of non-volatile storage elements is part of a first memory block;
    said second group of non-volatile storage elements is part of a second memory block, said first memory block and said second memory block are in a common memory bay;
    said plurality of first control lines comprise a plurality of bit lines; and
    said non-volatile storage elements comprise two-terminal non-volatile memory cells.

6. A method according to claim 1, wherein:
    said transitioning includes latching a first block enable signal, said first block enable signal is an input to a charge transfer circuit, said charge transfer circuit is coupled to said plurality of first control lines and to said plurality of second control lines, said first block enable signal controls the electrical coupling of said plurality of first control lines to said plurality of second control lines during said transitioning; and
    said transitioning includes changing said first group of non-volatile storage elements from said active state to said inactive state.

7. A method according to claim 1, wherein:
    said transitioning includes latching a first block enable signal, said first block enable signal controls a first switch, said first switch controls the electrical coupling of said plurality of first control lines to an intermediate node; and
    said transitioning includes generating a second block enable signal, said second block enable signal controls a second switch, said second switch controls the electrical coupling of said plurality of second control lines to said intermediate node, said transitioning includes said first block enable signal turning on said first switch at the same time said second block enable signal turns on said second switch.

8. A method according to claim 1, wherein:
    said active state is a write state.

9. A method according to claim 8, wherein:
    said plurality of first control lines are biased to one or more unselected voltages in a SET mode.

10. A method according to claim 8, wherein:
said plurality of first control lines are biased to one or more unselected voltages in a RESET mode.

11. A method for operating a non-volatile storage system, comprising:
decoding a read command from a host;
identifying a set of memory blocks that contain requested data to be read;
setting a first memory block into a read state, said first memory block comprises a first plurality of bit lines, said first plurality of bit lines are biased to one or more unselected bit line voltages when said first memory block is in said read state;
setting a second memory block into an inactive state, said second memory block comprises a second plurality of bit lines, said second plurality of bit lines are floated when said second memory block is in said inactive state;
reading data from said first memory block;
transitioning said first memory block into said inactive state and said second memory block into said read state, said transitioning includes sharing charge between said first memory block and said second memory block;
reading data from said second memory block; and
outputting the data read to said host.

12. A method for operating a non-volatile storage system, comprising:
decoding a read command from a host;
identifying a set of memory blocks that contain requested data to be read;
setting a first memory block into a read state, said first memory block comprises a plurality of first control lines;
setting a second memory block into an inactive state;
reading data from said first memory block;
transitioning said first memory block into said inactive state and said second memory block into said read state, said transitioning includes sharing charge between said first memory block and said second memory block, said transitioning includes controlling a charge transfer circuit, said charge transfer circuit is coupled to both said first memory block and said second memory block, said charge transfer circuit comprises a switch, said transitioning includes turning off said switch during charge sharing to prevent the electrical coupling of one or more unselected voltages to said plurality of first control lines, said transitioning includes latching a first block enable signal, said first block enable signal is an input to said charge transfer circuit and controls charge sharing between said first memory block and said second memory block during said transitioning;
reading data from said second memory block; and
outputting the data read to said host.

13. A method for operating a non-volatile storage system, comprising:
biasing a plurality of first control lines, each first control line is coupled to a respective subset of a first plurality of non-volatile storage elements, said first plurality of non-volatile storage elements are part of a first memory block;
floating a plurality of second control lines, each second control line is coupled to a respective subset of a second plurality of non-volatile storage elements, said second plurality of non-volatile storage elements are part of a second memory block; and
setting up read conditions for said second plurality of non-volatile storage elements, said setting up read conditions includes sharing charge between said plurality of first control lines and said plurality of second control lines, said plurality of first control lines comprise a plurality of unselected bit lines, each unselected bit line is biased to one or more unselected bit line voltages prior to said setting up read conditions.

14. A method according to claim 13, wherein:
said setting up read conditions includes controlling a charge transfer circuit, said charge transfer circuit includes a first switch and a second switch, said first switch electrically couples said plurality of first control lines to an intermediate node, said second switch electrically couples said intermediate node to said one or more unselected bit line voltages, said controlling the charge transfer circuit includes turning off said second switch during charge sharing to prevent the electrical coupling of said one or more unselected bit line voltages to said intermediate node, said controlling the charge transfer circuit includes latching a first enable signal, said first enable signal controls said first switch during said setting up read conditions.

15. A method for operating a non-volatile storage system, comprising:
biasing a plurality of first control lines, each first control line is coupled to a respective subset of a first plurality of non-volatile storage elements, said non-volatile storage elements comprise two-terminal non-volatile memory cells;
floating a plurality of second control lines, each second control line is coupled to a respective subset of a second plurality of non-volatile storage elements; and
setting up read conditions for said second plurality of non-volatile storage elements, said setting up read conditions includes sharing charge between said plurality of first control lines and said plurality of second control lines, said setting up read conditions includes latching a first block enable signal, said first block enable signal controls a first switch, said first switch controls the electrical coupling of said plurality of first control lines to an intermediate node, said setting up read conditions includes generating a second block enable signal, said second block enable signal controls a second switch, said second switch controls the electrical coupling of said plurality of second control lines to said intermediate node, said setting up read conditions includes said first block enable signal turning on said first switch at the same time said second block enable signal turns on said second switch.

16. A non-volatile storage system, comprising:
non-volatile storage elements including a first set of said non-volatile storage elements and a second set of said non-volatile storage elements;
a plurality of first control lines, each first control line is coupled to a respective subset of said first set of non-volatile storage elements;
a plurality of second control lines, each second control line is coupled to a respective subset of said second set of non-volatile storage elements; and
a charge transfer circuit coupled to both said plurality of first control lines and said plurality of second control lines, said charge transfer circuit comprises a first switch, said first switch controls charge sharing between said plurality of first control lines and said plurality of second control lines while setting up read conditions for said second set of non-volatile storage elements, said plurality of first control lines comprise a plurality of unselected bit lines, said plurality of unselected bit lines are biased to one or more unselected bit line voltages prior to said setting up read conditions.

17. The non-volatile storage system of claim 16, further comprising:
a latch, said first set of non-volatile storage elements is part of a first memory block, said latch latches a first block enable signal associated with said first memory block during said setting up read conditions, said first block enable signal controls said first switch.

18. A non-volatile storage system, comprising;
non-volatile storage elements including a first set of said non-volatile storage elements and a second set of said non-volatile storage elements;
a plurality of first control lines, each first control line is coupled to a respective subset of said first set of non-volatile storage elements, said plurality of first control lines comprise a plurality of unselected word lines;
a plurality of second control lines, each second control line is coupled to a respective subset of said second set of non-volatile storage elements; and
a charge transfer circuit coupled to both said plurality of first control lines and said plurality of second control lines, said charge transfer circuit comprises a first switch, said first switch controls charge sharing between said plurality of first control lines and said plurality of second control lines while setting up read conditions for said second set of non-volatile storage elements, said plurality of second control lines are not biased to any voltage prior to said setting up read conditions, said setting up read conditions includes latching a first block enable signal, said first block enable signal controls said first switch, said first switch controls coupling of said plurality of first control lines to an intermediate node, said setting up read conditions includes generating a second block enable signal, said second block enable signal controls a second switch, said second switch controls coupling of said plurality of second control lines to said intermediate node, said setting up read conditions includes said first block enable signal turning on said first switch at the same time said second block enable signal turns on said second switch.

19. A non-volatile storage system, comprising:
a first memory block comprising a plurality of first control lines, said first memory block set into a read state;
a second memory block comprising a plurality of second control lines, said second memory block set into an inactive state;
a charge transfer circuit coupled to both said plurality of first control lines and said plurality of second control lines, said charge transfer circuit controls charge sharing between said plurality of first control lines and said plurality of second control lines during a transitioning of said second memory block from said inactive state into said read state; and
a latch, said latch latches a first block enable signal associated with said first memory block during said transitioning, said first block enable signal controls the electrical coupling of said plurality of first control lines to said plurality of second control lines, said plurality of second control lines comprise a plurality of unselected bit lines.

20. A non-volatile storage system, comprising:
a first memory block comprising a plurality of first control lines, said first memory block set into a read state;
a second memory block comprising a plurality of second control lines, said second memory block set into an inactive state;
a charge transfer circuit coupled to both said plurality of first control lines and said plurality of second control lines, said charge transfer circuit controls charge sharing between said plurality of first control lines and said plurality of second control lines during a transitioning of said second memory block from said inactive state into said read state;
a latch, said latch latches a first block enable signal during said transitioning, said first block enable signal controls a first switch, said first switch controls the electrical coupling of said plurality of first control lines to an intermediate node; and
a second block enable signal, said second block enable signal controls a second switch, said second switch controls the electrical coupling of said plurality of second control lines to said intermediate node, said first block enable signal turns on said first switch at the same time said second block enable signal turns on said second switch.

* * * * *